(12) United States Patent
Daruwalla et al.

(10) Patent No.: US 11,923,807 B2
(45) Date of Patent: Mar. 5, 2024

(54) INTEGRATED CIRCUIT YIELD IMPROVEMENT

(71) Applicant: pSemi Corporation, San Diego, CA (US)

(72) Inventors: Parvez H. Daruwalla, San Diego, CA (US); Yucheng Tong, San Diego, CA (US); Jonathan James Klaren, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 463 days.

(21) Appl. No.: 17/331,436

(22) Filed: May 26, 2021

(65) Prior Publication Data

US 2022/0385240 A1 Dec. 1, 2022

(51) Int. Cl.
*H03F 1/22* (2006.01)
*G01R 31/28* (2006.01)
*H03F 3/195* (2006.01)
*H03F 3/24* (2006.01)
*H03F 3/72* (2006.01)

(52) U.S. Cl.
CPC ......... *H03F 1/223* (2013.01); *G01R 31/2834* (2013.01); *H03F 3/195* (2013.01); *H03F 3/245* (2013.01); *H03F 3/72* (2013.01); *H03F 2200/261* (2013.01); *H03F 2200/294* (2013.01); *H03F 2200/451* (2013.01)

(58) Field of Classification Search
CPC .......... H03F 1/223; H03F 3/195; H03F 3/245; H03F 3/72; H03F 2200/261; H03F 2200/294; H03F 2200/451; H03F 2200/306; H03F 1/565; G01R 31/2834; G01R 31/2822; G01R 31/2879; G01R 31/2856
USPC .............................. 330/311, 285, 296, 307, 2
See application file for complete search history.

(56) References Cited

U.S. PATENT DOCUMENTS 8,779,859 B2 * 7/2014 Su ........................... H03F 3/193
330/311
10,291,194 B2 * 5/2019 Ilkov .................... H03G 3/3036

* cited by examiner

*Primary Examiner* — Hieu P Nguyen
(74) *Attorney, Agent, or Firm* — JAQUEZ LAND GREENHAUS & McFARLAND LLP; John Land, Esq.

(57) ABSTRACT

Circuits and methods for improving IC yield during automated test equipment (ATE) calibration of circuit designs which require $I_{DD}$ calibration and use a closed feedback bias circuit, such as amplifier circuits. The circuit designs include bias branch/active circuit architectures where the active circuit includes one or more active devices. An example first embodiment uses an on-chip calibration switch between the on-chip grounds of a bias network and an active circuit comprising an amplifier. During calibration of the active circuit by the ATE, the calibration switch is closed, and after completion of calibration, the calibration switch is opened. An example second embodiment utilizes an active on-chip feedback loop calibration circuit to equalize voltages between the on-chip grounds of a bias network and an active circuit comprising an amplifier during calibration of the active circuit. Both embodiments mitigate or overcome miscalibration of active circuit current settings resulting from ATE test probe resistance.

20 Claims, 7 Drawing Sheets

700

```
┌─────────────────────────────────────┐
│ In an IC including an active circuit including a
│ first ground connection and a bias network
│ coupled to the active circuit and including a
│ second ground connection, the bias network
│ configured to provide a calibrated bias voltage      │─── 702
│ to the active circuit corresponding to a specified
│ current for the active circuit, coupling a
│ calibration circuit to the first ground connection
│ and the second ground connection, wherein the
│ calibration circuit is part of the integrated circuit
└─────────────────────────────────────┘
                    ↓
┌─────────────────────────────────────┐
│ Configuring the calibration circuit to balance a
│ voltage at the first ground connection with a        │─── 704
│ voltage at the second ground connection during
│ calibration of the active circuit
└─────────────────────────────────────┘
```

FIG. 7

INTEGRATED CIRCUIT YIELD IMPROVEMENT

BACKGROUND

(1) Technical Field

The invention relates to electronic circuits, and more particularly to circuits and methods for improving integrated circuit yields, particularly radio frequency integrated circuit amplifiers.

(2) Background

Many modern electronic systems include radio frequency (RF) receivers; examples include personal computers, tablet computers, wireless network components, televisions, cable system "set top" boxes, radar systems, and cellular telephones. Many RF receivers are paired with RF transmitters in the form of transceivers, which often are quite complex two-way radios. In some cases, RF transceivers are capable of transmitting and receiving across multiple frequencies in multiple bands. While many common RF transceivers operate at about 5 GHz or less, an industry trend has emerged in which increasingly higher radio frequencies (e.g., about 8 GHz and higher) are being used to increase bandwidth and channel availability.

RF transceivers generally include a number of circuits such as amplifiers, oscillators, multipliers, mixers, etc., that utilize an active circuit comprising one or more transistors having a specified current level. A common configuration for such an active circuit is a pair of field-effect transistors (FETs) in a cascode arrangement. More specifically, a FET-based cascode circuit is a two-stage amplifier that consists of a common source stage feeding into a common gate stage. Compared to a single amplifier stage, a cascode combination may have one or more of the following characteristics: higher input-output isolation, higher input impedance, high output impedance, and/or higher bandwidth.

One example of a circuit that often utilizes a cascode-based active circuit is an amplifier. Amplifiers are a common component in RF transmitters and receivers, and are frequently used for power amplification of transmitted RF signals and for low-noise amplification of received RF signals. For many RF systems, particularly those requiring portability (e.g., cellular telephones, WiFi-connected computers, cameras, and other devices, etc.), it has become common to use complementary metal-oxide semiconductor (CMOS) fabrication technology to create low cost, low power, complex integrated circuits (ICs). CMOS device technology improvements, such as silicon-on-sapphire (SOS) CMOS, silicon-on-insulator (SOI) CMOS, and ever-shrinking field FET device channel lengths, are putting the RF performance metrics of silicon-based CMOS transistors on par with rival gallium arsenide (GaAs) technologies. Because of their various advantages, CMOS transistor ICs will be used in numerous new designs for high frequency RF transmitters and receivers.

Modern RF transmitters and receivers, whether stand-alone or as part of a transceiver, are generally fabricated as multiple individual dies or "chips" on a semiconductor wafer. For mass production, each die is generally tested using automated test equipment (ATE) systems before singulation of the dies for packaging, either individually or as part of a module of multiple ICs. For electrical testing, a set of microscopic probes are placed in contact with designed "bumps" on a die of the wafer so as to apply power and measure circuit characteristics (e.g., voltages, currents, capacitances, inductances, impedances, frequencies, and/or logic signals). Testing of RF ICs can be challenging owing at least in part to the continuing trend towards smaller die sizes and higher RF frequencies.

To better understand the challenges of testing RF ICs, it may be useful to consider an example RF circuit, such as an amplifier circuit that includes a cascode-based active circuit. FIG. 1 is a simplified schematic diagram of a generalized embodiment of a prior art low-noise amplifier (LNA) circuit 100. A cascode-based active circuit 102 comprising a stack of two serially-connected FETs $M_{CS}$, $M_{CG}$ in a cascode arrangement is configured to receive an RF input signal, $RF_{IN}$, at the gate of the lower common-source FET $M_{CS}$ through a DC blocking capacitor $C_B$. The source of $M_{CS}$ is coupled thorough a degeneration inductor $L_{DEG}$ to an IC bump 104, which would be connected to RF ground during operation. The degeneration inductor $L_{DEG}$, which has an inherent resistance $R_{DEG}$, performs several functions, including obtaining a good dynamic range, achieving high sensitivity (e.g., a good noise figure NF) with low power consumption, and helping with input impedance matching. The source of the upper common-gate FET $M_{CG}$ is coupled to the drain of $M_{CS}$, and the drain of $M_{CG}$ in the active circuit 102 provides an amplified RF output signal, $RF_{OUT}$ through a tuning capacitor C. In this example, a tuning and load circuit 106, comprising a resistor R1, an inductor L1, and a capacitor C1 coupled in parallel, is connected between a source voltage $V_{DD}$ and the drain of $M_{CG}$. In practical circuits, in order to overcome a relatively low breakdown voltage per CMOS FET, multiple FETS may be series-coupled or "stacked" above FET $M_{CG}$ so that the total RF voltage swing occurring across the active circuit 102 is distributed over the stacked CMOS devices. That output of the active circuit 102 would then generally be taken from the drain of the uppermost FET in the stack.

In the illustrated example, a bias network 108 comprising a stack of two serially-connected FETs $M_{R\_CS}$, $M_{R\_CG}$ in a cascode reference arrangement is configured such that the gate of common-source FET $M_{R\_CS}$ is coupled to the gate of $M_{CS}$ through a filter circuit comprising a Serial resistor $R_{CS}$ and a shunt capacitor $C_{CS}$, and the gate of common-gate $M_{R\_CG}$ is coupled to the gate of $M_{CG}$ through a filter circuit comprising a serial resistor $R_{CG}$ and a shunt capacitor CCG. The bias network 108 provides a bias voltage $V_{GS1}$ to the gate of FET $M_{CG}$ and a bias voltage $V_{GS0}$ to the gate of FET $M_{CS}$. The source of $M_{R\_CS}$ is coupled thorough a resistor R to an IC bump 110, which would be connected to RF ground during operation. A current source 112 coupled to $V_{DD}$ provides power to the bias network 108 through the drain of $M_{R\_CG}$. As with the active circuit 102, the bias network 108 may be configured with a stack of n serially-connected FETs above FET $M_{R\_CG}$ such that a particular voltage level can be withstood without subjecting any of the constituent FETs to a voltage exceeding the FET's breakdown voltage.

Note that in many applications, each FET gate in the illustrated active circuit 102 and the bias network 108 may include a corresponding gate resistor and gate capacitor, not shown for clarity; the gate capacitor sets up the RF voltage division in the stack and the resistor is used to isolate the RF signal from DC in an applied bias signal. Additional well-known circuit elements that might be included in some applications, such as DC block capacitors, output impedance matching circuitry, and additional filters, are omitted for clarity.

In the illustrated example, the purpose of the bias network 108 is to essentially act as a current mirror that sees bias voltages similar to the active circuit 102, with the devices in the bias network 108 being scaled-down replicas of the devices in the active circuit 102 (and, accordingly, the resistor R should be scaled to match the inherent resistance $R_{DEG}$ of the inductor $L_{DEG}$). For example, if the devices in the bias network 108 are 1/30 of the size of the devices in the active circuit 102, the scaling factor m would be 30 (the size of such devices may be defined in terms of transistor area, gate length, gate width, etc., so long as the same aspect is compared). The FET device stacking in the bias network 108 replicates the bias voltages in the active circuit 102 stack, thus resulting in a more accurate current mirror.

An important function of the bias network 108 is to set the bias voltage $V_{GS0}$ applied to the gate of FET $M_{CS}$ in the active circuit 102, and thereby control the current through the active circuit 102. For a specified test load coupled to $RF_{OUT}$ requiring a specified current $I_{DD}$, $V_{GS0}$ is calibrated appropriately by setting the current source 112 in the bias network 108 to a corresponding scaled (lower) value. That calibration setting is then generally permanently set by, for example, burning a fusible link on the IC die.

A problem can arise during IC die testing that reduces the yield of IC dies from a wafer. Referring back to FIG. 1, during ATE testing, the IC bumps 104, 110 are coupled to an external set of circuits 114. In the illustrated example, a first test probe having a contact resistance Rcontact1 is coupled to IC bump 110 through a parasitic inductance $L_{X1}$. Similarly, a second test probe having a contact resistance Rcontact2 is coupled to IC bump 104 through a parasitic inductance $L_{X2}$. The ideal resistance for each test probe is zero ohms, but in practice, the test probes get dirty and their resistance increases (cases have been seen where the contact resistances have increased to about 30 ohms). At high values (e.g., at or above about 10 ohms), test probe resistance causes poor $I_{DD}$ calibration. More specifically, amplifiers lacking a common, on-chip ground connection between the low-current bias network 108 and the high-current active circuit 102 can see different ground voltages due to test probe resistance. This "ground" difference is critical during the calibration/fusing phase of ATE, causing source degeneration in the active circuit 102, forcing a higher bias setting for FET $M_{R\_CS}$ to be fused to reach a targeted $I_{DD}$. Thereafter, when the IC die is assembled within a module (e.g., with other ICs), the module ground resistance coupled to the IC bumps 104, 110 is typically about zero ohms. That lower resistance will result in an $I_{DD}$ value higher than expected since the $I_{DD}$ value was set as a function of the higher test probe resistance. Since the $I_{DD}$ setting is fused during production testing and cannot be changed (i.e., un-fused), this means the entire module needs to be scrapped as failing to meet the specification for $I_{DD}$.

For example, referring to FIG. 1, if the contact resistance Rcontact2 is about 30 ohms rather than zero ohms and the desired $I_{DD}$ current through the active circuit 102 is about 10 mA, then the bias network 108 tries to increase $V_{GS0}$ to the active circuit 102 to compensate for the higher voltage at node 104. More specifically, the "ground" seen by the active circuit 102 is about 300 mV (10 mA*30 ohms) rather than zero volts. If the active circuit 102 is configured to have about a 30 to 1 current ratio with respect to the bias network 108, then the "ground" seen by the bias network 108 is about 30 mV. This difference in "ground" potential causes the bias network 108 to generate a higher offset voltage for $V_{GS0}$ in order to reach the target $I_{DD}$ of 10 mA. That increased, non-ideal $V_{GS0}$ value is higher than it would be had the contact resistance Rcontact2 been zero ohms and is permanently set (e.g., fused) on the IC die. Accordingly, when the tested IC die is assembled into a module in which the resistance to module ground is zero, the current through the active circuit 102 will be higher than the specified 10 mA, and the module is a loss.

While the example shown in FIG. 1 is a cascode pair common to LNAs, the above problems arise as well in testing of power amplifiers and other circuits having a similar bias branch/active circuit architecture (e.g., having at least a bias FET $M_{R\_CS}$ and a common-source FET $M_{CS}$ having a common gate bias $V_{GS0}$).

Accordingly, there is a need for circuits and methods for improving IC yield during ATE testing of circuitry that includes a bias branch/active circuit architecture. The present invention addresses this and other needs.

SUMMARY

The present invention encompasses circuits and methods for improving IC yield during automated test equipment (ATE) calibration of circuit designs which require $I_{DD}$ calibration and use a closed feedback bias circuit, such as amplifier circuits and other circuitry that include a bias branch/active circuit architecture. An example first embodiment utilizes an on-chip calibration switch between the on-chip grounds of a bias network and an active circuit comprising an amplifier, where the active circuitry may be, for example, a cascode amplifier. During calibration of the active circuit by the ATE, the calibration switch is closed, and after completion of calibration, the calibration switch is opened. An example second embodiment utilizes an active on-chip feedback loop calibration circuit to equalize voltages between the on-chip grounds of a bias network and an active circuit comprising an amplifier during calibration of the active circuit.

An example embodiment encompasses an integrated circuit including: an active circuit including a first ground connection; a bias network coupled to the active circuit and including a second ground connection, the bias network configured to provide a calibrated bias voltage to the active circuit corresponding to a specified current for the active circuit; and a calibration switch coupled between the first ground connection and the second ground connection, the calibration switch configured to be closed during calibration of the active circuit and open after completion of calibration of the active circuit.

Another example embodiment encompasses an integrated circuit including: an active circuit including a first ground connection; a bias network coupled to the active circuit and including a second ground connection, the bias network configured to provide a calibrated bias voltage to the active circuit corresponding to a specified current for the active circuit; and a calibration circuit coupled to the first ground connection and to the second ground connection, the calibration circuit configured to balance a voltage at the first ground connect with a voltage at the second ground connection during calibration of the active circuit. The calibration circuit may include: an op-amp having a first input coupled to the first ground connection, a second input coupled to the second ground connection, and an output indicative of a difference in voltage between the first and second ground connections; and a MOSFET having a gate coupled to the output of the op-amp, a source coupled to a voltage source, and a drain coupled to one of the first input or second input of the op-amp in a negative feedback configuration.

The details of one or more embodiments of the invention are set forth in the accompanying drawings and the descrip-

DESCRIPTION OF THE DRAWINGS

FIG. 7 is a process flow chart showing a second method of configuring an integrated circuit to be calibrated by automated test equipment, the integrated circuit including an active circuit including a first ground connection and a bias network coupled to the active circuit and including a second ground connection, the bias network configured to provide a calibrated bias voltage to the active circuit corresponding to a specified current for the active circuit.

Like reference numbers and designations in the various drawings indicate like elements unless the context requires otherwise.

DETAILED DESCRIPTION

Figure 1:
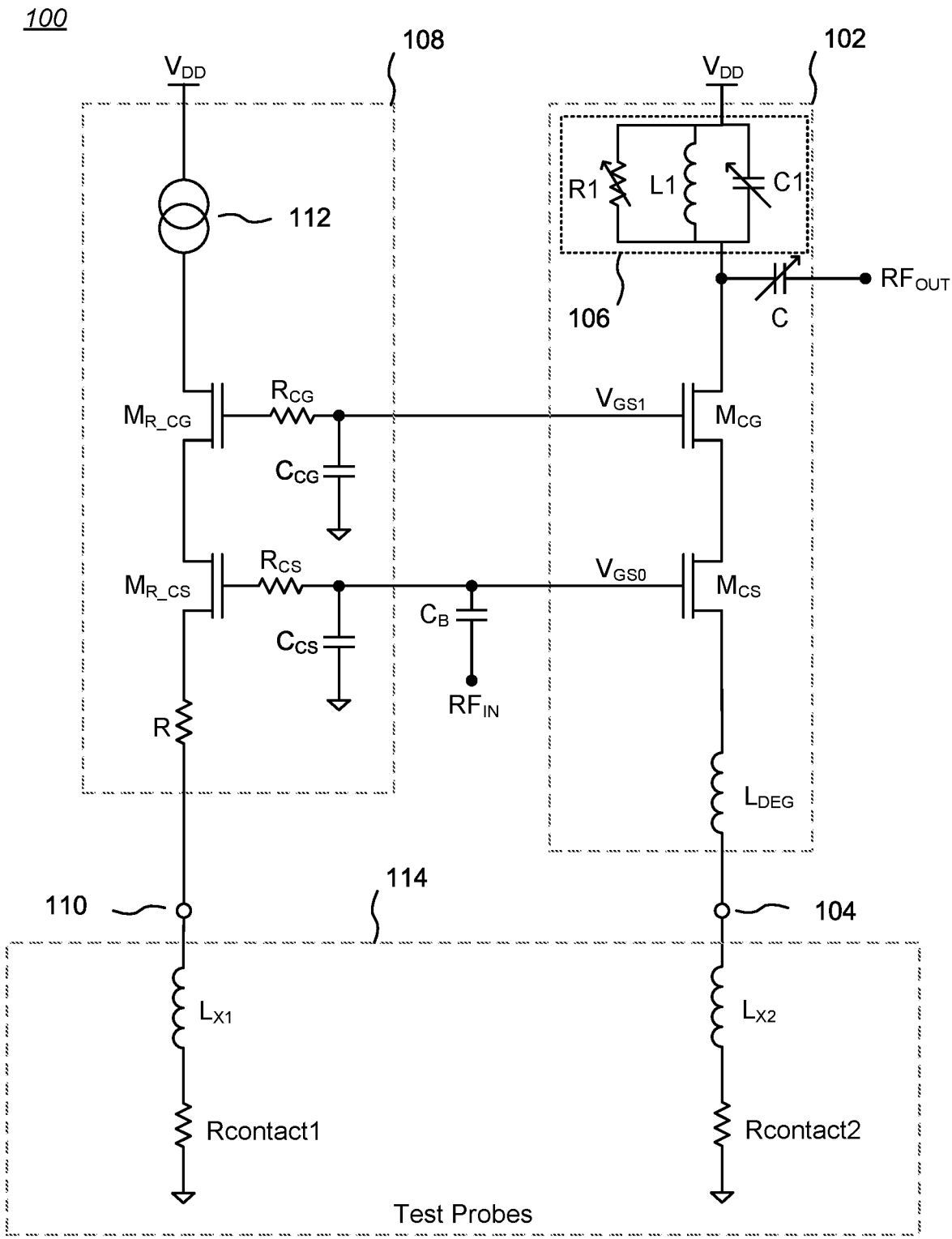
FIG. 1 is a simplified schematic diagram of a generalized embodiment of a prior art low-noise amplifier (LNA) circuit.

The present invention encompasses circuits and methods for improving IC yield during automated test equipment (ATE) calibration of circuit designs which require $I_{DD}$ calibration and use a closed feedback bias circuit, such as amplifier circuits and other circuitry that include a bias branch/active circuit architecture. An example first embodiment utilizes an on-chip calibration switch between the on-chip grounds of a bias network and an active circuit comprising an amplifier, where the active circuitry may be, for example, a cascode amplifier. During calibration of the active circuit by the ATE, the calibration switch is closed, and after completion of calibration, the calibration switch is opened. An example second embodiment utilizes an active on-chip feedback loop calibration circuit to equalize voltages between the on-chip grounds of a bias network and an active circuit comprising an amplifier during calibration of the active circuit.

First Embodiment

It might seem that the problem of probe test resistance could be remedied by connecting (shorting) the grounds of the active circuit 102 and the bias network 108 together on chip, so that the active circuit 102 sees the "lower" of the test probe resistances and both the bias network 108 and the active circuit 102 see the same circuit ground. However, this approach causes a problem in actual circuit operation. At higher RF frequencies (above about 5 GHz, and especially above about 8 GHz), since the grounds of the active circuit 102 and the bias network 108 are shorted on chip, an RF signal path exists between the two branches that can inject noise from the bias network 108 into the active circuit 102. Even if the module ground is at zero ohms, the parasitic inductances $L_{X1}$, $L_{X2}$ present a higher impedance to noise than the short between the grounds of the active circuit 102 and the bias network 108, thus favoring RF noise transmission to the active circuit 102 rather than to module ground. Moreover, the parasitic inductances $L_{X1}$, $L_{X2}$ increase as frequency increases, exacerbating the noise problem. Such noise injection results in a higher noise figure (NF) and is highly undesirable, particularly for an LNA. Simulations of an on-chip shorted-ground configuration have suggested that NF degradation becomes particularly significant at frequencies at and above about 8 GHz, nearly doubling for a ground inductance value of about 0.2 nH and a Q value of 20.

It should be noted that the trend is for modules to get smaller and contain more components (e.g., ICs, SMDs) and connection routing is getting increasingly dense, which results in module grounds getting worse (i.e., higher ground impedance and inductance). Further, earlier module designs generally had a full ground plane but the ground structure in new module designs is often broken up to allow for this additional routing, which further negatively impacts the characteristics of a module ground. Stricter height requirements for modules also means that some layers are sacrificed, resulting in even worse ground plane connections.

Figure 2:
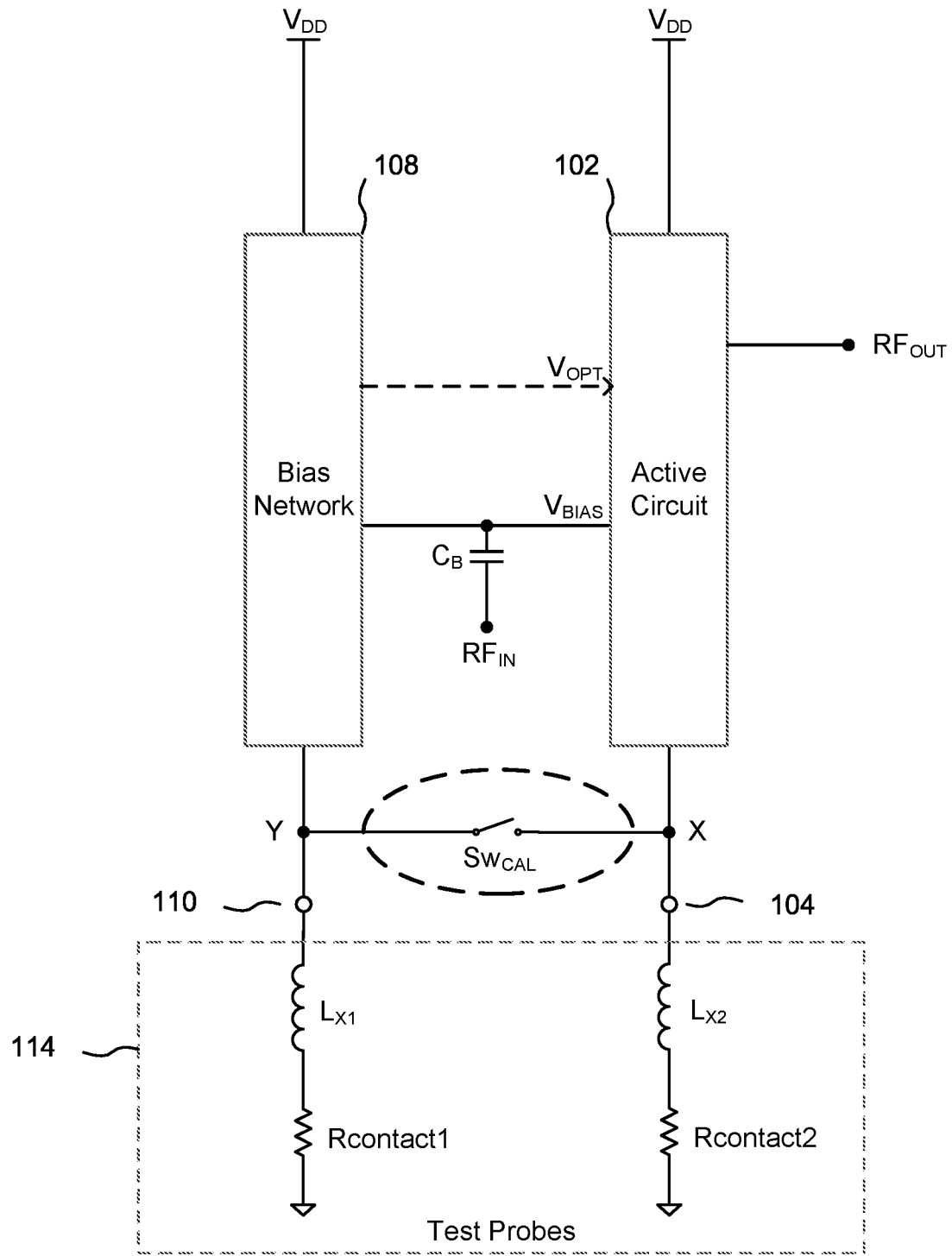
FIG. 2 is a simplified schematic and block diagram of a first embodiment of an LNA circuit modified to improve yield during automated testing while maintaining good noise performance in operation.

FIG. 2 is a simplified schematic and block diagram of a first embodiment of an LNA circuit 200 modified to improve yield during automated testing while maintaining good noise performance in operation. FIG. 2 is similar in some respects to the embodiment shown in FIG. 1, but more generalized. For example, the active circuit 102 may be any of several types of amplifying circuits, including cascode, folded cascode, common-source only, etc. The bias network 108 is shown as providing a single bias voltage $V_{BIAS}$ to the active circuit 102, which may be, for example, a gate-source bias. The bias network 108 may also provide one or more optional bias voltages, $V_{OPT}$, depending on the internal architecture of the active circuit 102.

Of note, the example LNA circuit also includes an added circuit element in the form of an on-chip calibration switch $Sw_{CAL}$ between the ground legs of the active circuit 102 and the bias network 108 (i.e., connecting a node X between the IC bump 104 and the active circuit 102 to a node Y between the IC bump 110 and the bias network 108).

During ATE testing of an IC die, the calibration switch $Sw_{CAL}$ is set to a CLOSED (conducting) state, thus equalizing the "ground" potential seen by the active circuit 102 and the bias network 108. Accordingly, the test probes in an ATE system see a total resistance that is lower than the individual contact resistances of the test probes, allowing for more accurate calibration of the $V_{GS0}$ provided by the bias network 108 to the active circuit 102. For example, if a first test probe has a contact resistance of 30 ohms and a second test probe has a contact resistance of 10 ohms, the connection of the X and Y nodes through the calibration switch $Sw_{CAL}$ will result in the active circuit 102 seeing a resistance of only 7.5 ohms (30 ohms in parallel with 10 ohms).

At all times after ATE testing, the calibration switch $Sw_{CAL}$ is set to an OPEN (nonconducting or blocking) state, thereby isolating the on-chip grounds of the active circuit 102 and the bias network 108 and preventing noise injection from the bias network 108 into the LNA core 102. Accordingly, the noise figure of the amplifier circuit is not affected during normal operation.

The calibration switch $Sw_{CAL}$ may be implemented in a variety of ways, including a FET (particularly a MOSFET), a fusible link (since the switch is only used during calibration), or even a microelectromechanical system (MEMS) switch. The calibration switch $Sw_{CAL}$ need not be very large, and, since the calibration switch $Sw_{CAL}$ is in parallel with module ground during normal operation, the $R_{ON}$ and $C_{OFF}$ characteristics of the calibration switch $Sw_{CAL}$ generally are not critical. Further, when using a FET as the calibration switch $Sw_{CAL}$, the ground nodes X and Y are connected to each other using essentially anti-parallel diodes (a characteristic of the FET switch), which provide ESD protection, and accordingly, the calibration switch $Sw_{CAL}$ itself will carry no ESD currents.

Including an on-chip calibration switch $Sw_{CAL}$ benefits any amplifier design (LNA or power amplifier) that requires $I_{DD}$ calibration using an ATE system, as well as any other circuit design which requires $I_{DD}$ calibration and uses a closed feedback bias circuit (e.g., oscillators, multipliers, mixers).

Second Embodiment

Figure 3:
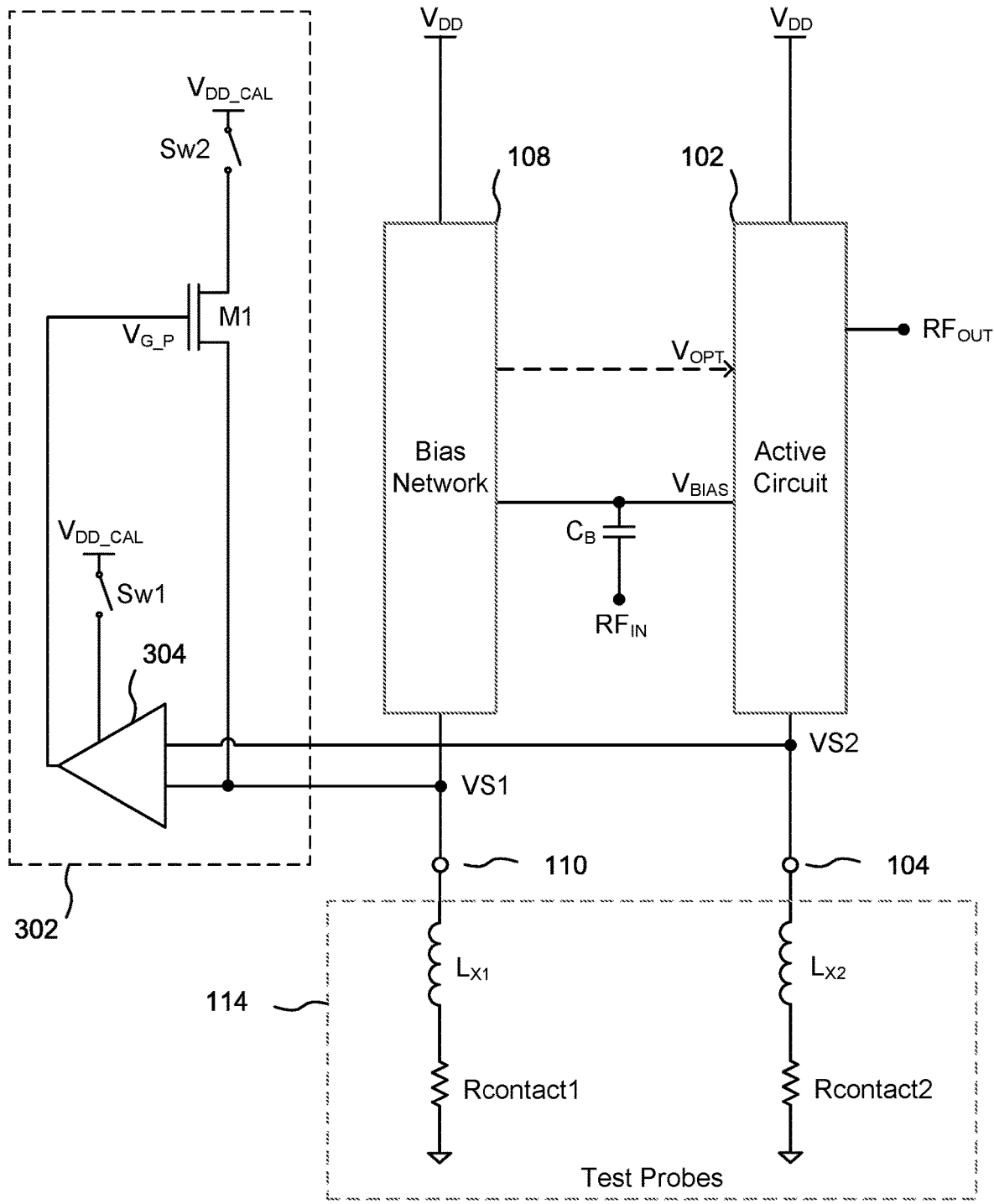
FIG. 3 is a simplified schematic and block diagram of a second embodiment of an LNA circuit modified to improve yield during automated testing while maintaining good noise performance in operation.

FIG. 3 is a simplified schematic and block diagram of a second embodiment of an LNA circuit 300 modified to improve yield during automated testing while maintaining good noise performance in operation. Similar in many respects to the embodiment shown in FIG. 2, an added element is a calibration circuit 302 rather than a simple calibration switch $Sw_{CAL}$.

The example calibration circuit 302 includes an op-amp 304 and a MOSFET M1. A first input of the op-amp 304 is coupled to a ground node VS1 between the IC bump 110 and the bias network 108, and a second of the op-amp 304 is coupled to a ground node VS2 between the IC bump 104 and the active circuit 102. The op-amp 304 is powered from a voltage $V_{DD\_CAL}$ through a first switch Sw1. The output of the op-amp 304 is coupled to the gate of MOSFET M1 and is indicative of a difference in voltage between the first and second ground nodes VS1, VS2. The source of the MOSFET M1 is coupled to the voltage $V_{DD\_CAL}$ through a second switch Sw2. The drain of MOSFET M1 is coupled to the second input of the op-amp 304.

The voltage $V_{DD\_CAL}$ may be from a distinct power supply or may be derived from $V_{DD}$. The switches Sw1, Sw2 may be implemented in a variety of ways, including a FET (particularly a MOSFET), a fusible link (since the switches are only used during calibration), or even as microelectromechanical system—MEMS—switches. In alternative embodiments, the voltage $V_{DD\_CAL}$ may be independently switchable between ON and OFF states, and thus the switches Sw1 and Sw2 may be omitted.

The calibration circuit 302 is configured to use the op-amp 304 in a negative feedback loop to set the gate voltage, $V_{G\_P}$, of the MOSFET M1 during ATE testing of an IC die. Assuming the op-amp 304 has infinite gain, the op-amp 304 differential output will adjust $V_{G\_P}$ until the voltages at VS1 and VS2 are equal once the MOSFET M1 starts to pump current. When VS1=VS2, there will be no difference in $I_{DD}$ as calibrated on the IC die and as measured in a module containing that die (assuming the impedance matching from the bias network 108 to the active circuit 102 is essentially perfect). Accordingly, $V_{GS0}$—which sets $I_{DD}$—can be accurately calibrated and set (e.g., by blowing fusible links) on the IC die, and $I_{DD}$ will stay the same when the IC die is assemble in a module.

After ATE testing of an IC die, the calibration circuit 302 is disabled (e.g., by opening switches Sw1 and Sw2 or permanently switching $V_{DD\_CAL}$ OFF), and accordingly will not affect the total current through and the RF performance of the LNA circuit 300 during normal operation.

As should be clear, the calibration circuit 302 may be implemented in a number of ways to perform the same function. Including an on-chip calibration circuit 302 benefits any amplifier design (LNA or power amplifier) that requires $I_{DD}$ calibration using an ATE system, as well as any other circuit design which requires $I_{DD}$ calibration and uses a closed feedback bias circuit (e.g., oscillators, multipliers, mixers).

System Aspects

Embodiments of the present invention are useful in a wide variety of larger radio frequency (RF) circuits and systems for performing a range of functions, including radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Figure 4:
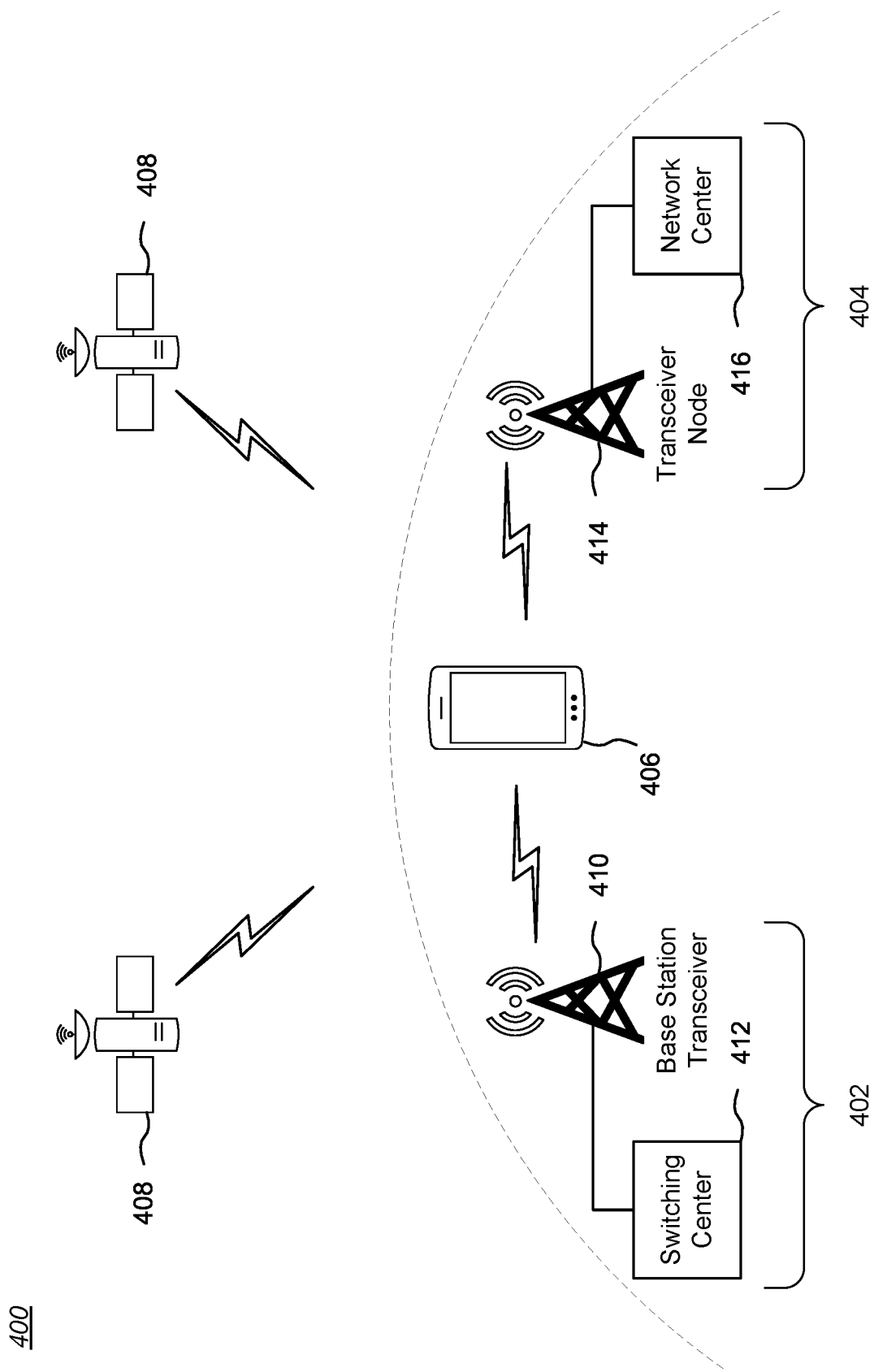
FIG. 4 illustrates an exemplary prior art wireless communication environment comprising different wireless communication systems and may include one or more mobile wireless devices.

As an example of wireless RF system usage, FIG. 4 illustrates an exemplary prior art wireless communication environment 400 comprising different wireless communication systems 402 and 404, and may include one or more mobile wireless devices 406.

A wireless device 406 may be capable of communicating with multiple wireless communication systems 402, 404 using one or more of the telecommunication protocols noted above. A wireless device 406 also may be capable of communicating with one or more satellites 408, such as navigation satellites (e.g., GPS) and/or telecommunication satellites. The wireless device 406 may be equipped with multiple antennas, externally and/or internally, for operation on different frequencies and/or to provide diversity against deleterious path effects such as fading and multipath interference. A wireless device 406 may be a cellular phone, a personal digital assistant (PDA), a wireless-enabled computer or tablet, or some other wireless communication unit or device. A wireless device 406 may also be referred to as a mobile station, user equipment, an access terminal, or some other terminology.

The wireless system 402 may be, for example, a CDMA-based system that includes one or more base station transceivers (BSTs) 410 and at least one switching center (SC) 412. Each BST 410 provides over-the-air RF communication for wireless devices 406 within its coverage area. The SC 412 couples to one or more BSTs in the wireless system 402 and provides coordination and control for those BSTs.

The wireless system 404 may be, for example, a TDMA-based system that includes one or more transceiver nodes 414 and a network center (NC) 416. Each transceiver node 414 provides over-the-air RF communication for wireless devices 406 within its coverage area. The NC 416 couples to one or more transceiver nodes 414 in the wireless system 404 and provides coordination and control for those transceiver nodes 414.

In general, each BST 410 and transceiver node 414 is a fixed station that provides communication coverage for wireless devices 406, and may also be referred to as base stations or some other terminology. The SC 412 and the NC 416 are network entities that provide coordination and control for the base stations and may also be referred to by other terminologies.

Figure 5:
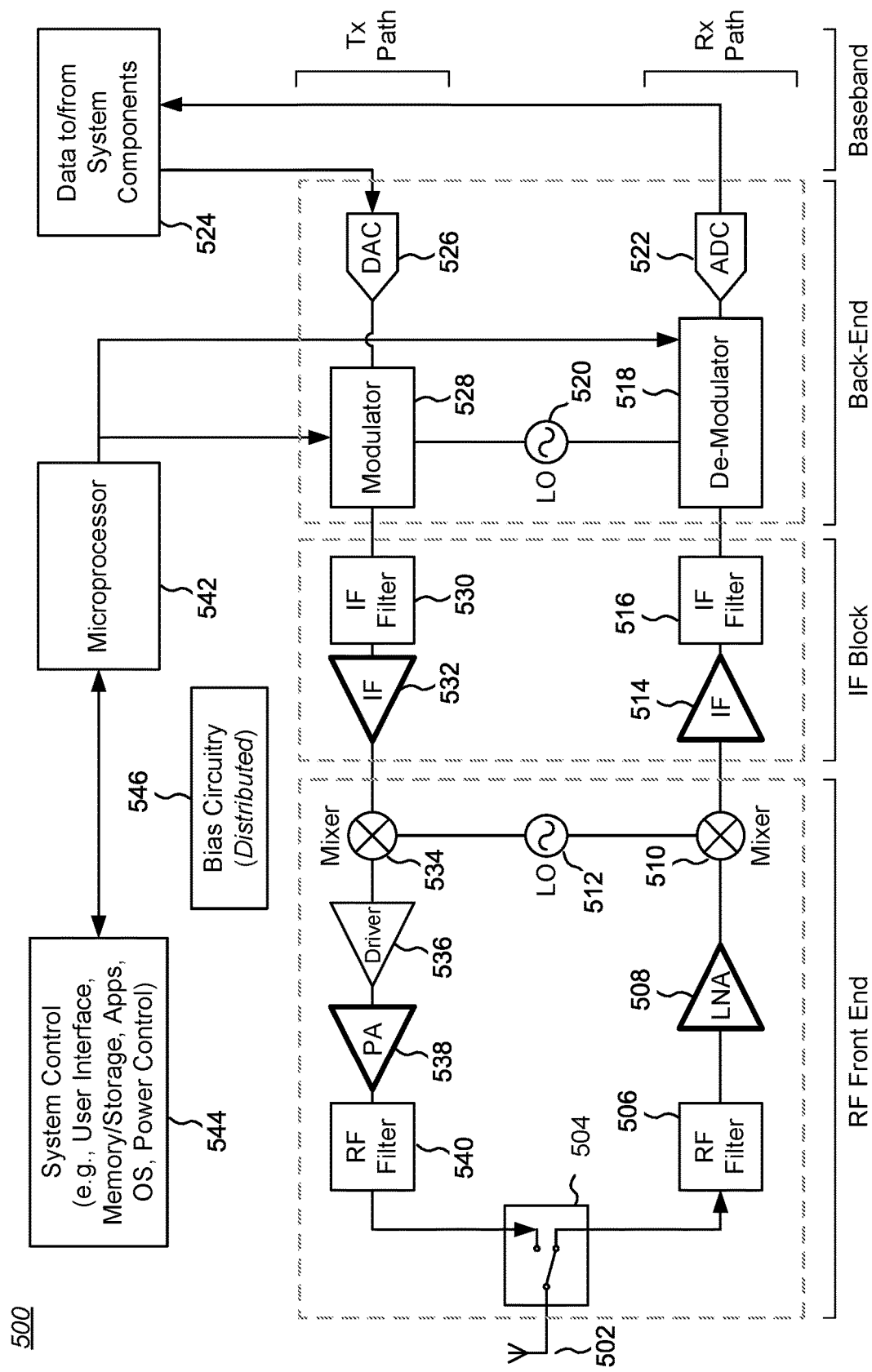
FIG. 5 is a block diagram of a transceiver that might be used in a wireless device, such as a cellular telephone, and which may beneficially incorporate an embodiment of the present invention for improved performance and compliance to specifications.

An important aspect of any wireless system, including the systems shown in FIG. 4, is in the details of how the component elements of the system perform. FIG. 5 is a block diagram of a transceiver 500 that might be used in a wireless device, such as a cellular telephone, and which may beneficially incorporate an embodiment of the present invention for improved performance and compliance to specifications. As illustrated, the transceiver 500 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 502 and a switching unit 504, which may be implemented with active switching devices (e.g., field effect transistors or FETs), or with passive devices that implement frequency-domain multiplexing, such as a diplexer or duplexer. An RF filter 506 passes desired received RF signals to a low noise amplifier (LNA) 508, the output of which is combined in a mixer 510 with the output of a first local oscillator 512 to produce an intermediate frequency (IF) signal. The IF signal may be amplified by an IF amplifier 514 and subjected to an IF filter 516 before being applied to a demodulator 518, which may be coupled to a second local oscillator 520. The demodulated output of the demodulator 518 is transformed to a digital signal by an analog-to-digital converter 522 and provided to one or more system components 524 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 524 is transformed to an analog signal by a digital-to-analog converter 526, the output of which is applied to a modulator 528, which also may be coupled to the second local oscillator 520. The modulated output of the modulator 528 may be subjected to an IF filter 530 before being amplified by an IF amplifier 532. The output of the IF amplifier 532 is then combined in a mixer 534 with the output of the first local oscillator 512 to produce an RF signal. The RF signal may be amplified by a driver 536, the output of which is applied to a power amplifier (PA) 538. The amplified RF signal may be coupled to an RF filter 540, the output of which is coupled to the antenna 502 through the switching unit 504.

Of note, any or all of the amplifiers shown in FIG. 5 (e.g., LNA 508, IF amplifier 514, IF amplifier 532, and/or PA 538) beneficially may be similar to the example embodiments shown in FIG. 2 or 3, which provide for more accurate calibration of $I_{DD}$ while not affecting performance during normal operation.

The operation of the transceiver 500 is controlled by a microprocessor 542 in known fashion, which interacts with system control components (e.g., user interfaces, memory/storage devices, application programs, operating system software, power control, etc.). In addition, the transceiver 500 will generally include other circuitry, such as bias circuitry 546 (which may be distributed throughout the transceiver 500 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 500 may be in a positioned in a different order (e.g., filters) or omitted. Other components can be (and usually are) added (e.g., additional filters, impedance matching networks, variable phase shifters/attenuators, power dividers, etc.).

As a person of ordinary skill in the art will understand, an RF system architecture is beneficially impacted by the current invention in critical ways, including better LNA performance and compliance with amplifier specifications. These system-level improvements are specifically enabled by the current invention and enable embodiments of the invention to meet the strict performance specifications of customers and a number of RF standards. The current invention is therefore critical to the embodiments of the overall system shown in FIG. 5.

Methods

Another aspect of the invention includes methods for configuring an integrated circuit to be calibrated by automated test equipment, where the IC includes a bias branch/active circuit architecture (e.g., having at least a bias FET $M_{R\_CS}$ and a common-source FET $M_{CS}$ having a common gate bias $V_{GS0}$).

Figure 6:
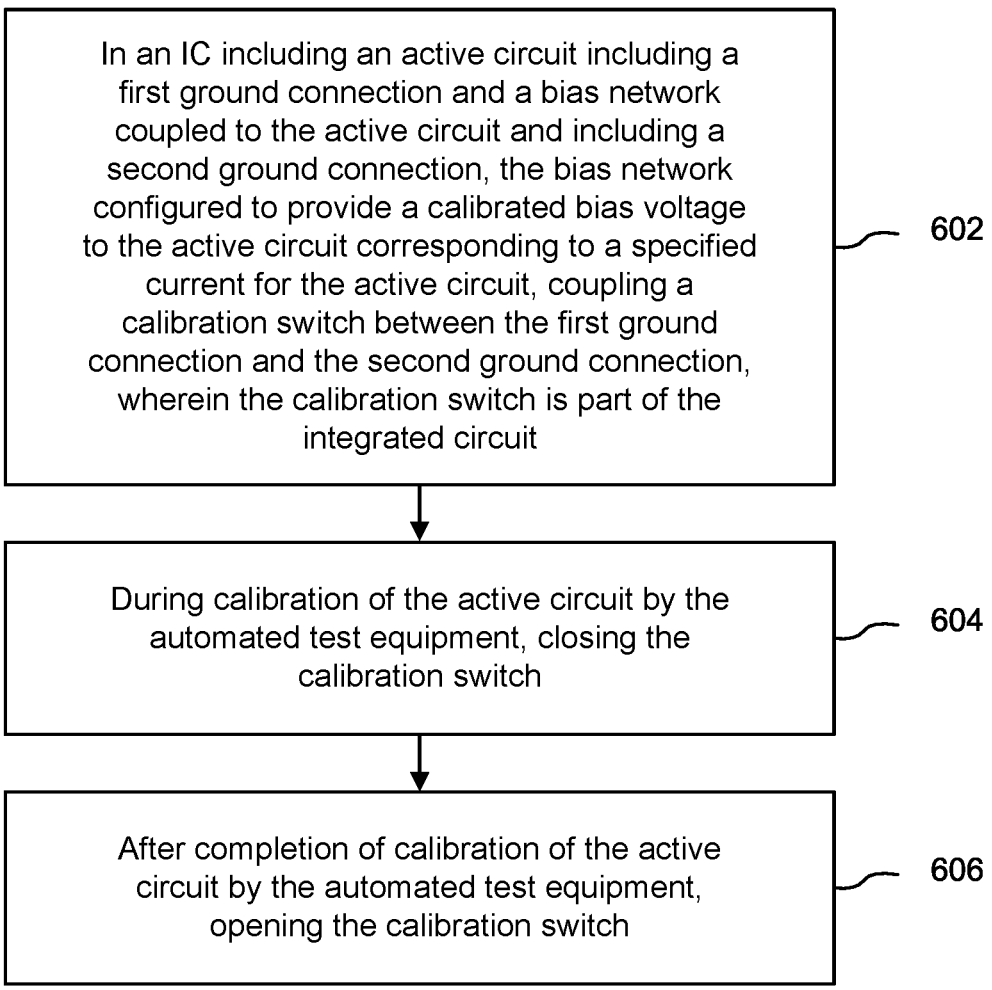
FIG. 6 is a process flow chart showing a first method of configuring an integrated circuit to be calibrated by automated test equipment, the integrated circuit including an active circuit including a first ground connection and a bias network coupled to the active circuit and including a second ground connection, the bias network configured to provide a calibrated bias voltage to the active circuit corresponding to a specified current for the active circuit.

For example, FIG. 6 is a process flow chart 600 showing a first method of configuring an integrated circuit to be calibrated by automated test equipment, the integrated circuit including an active circuit including a first ground connection (e.g., a cascode-based amplifier) and a bias network coupled to the active circuit and including a second ground connection, the bias network configured to provide a calibrated bias voltage to the active circuit corresponding to a specified current for the active circuit. The method includes: coupling a calibration switch between the first ground connection and the second ground connection, wherein the calibration switch is part of the integrated circuit [BLOCK 602]; during calibration of the active circuit by the automated test equipment, closing the calibration switch [BLOCK 604]; and, after completion of calibration of the active circuit by the automated test equipment, opening the calibration switch [BLOCK 606].

Additional aspects of the above method may include one or more of the following: wherein the integrated circuit is a low-noise amplifier; wherein the integrated circuit is a power amplifier; wherein the calibration switch is a field effect transistor; wherein the calibration switch is a fusible link; and/or wherein the calibration switch is permanently opened after completion of calibration of the active circuit.

As another example, FIG. 7 is a process flow chart 700 showing a second method of configuring an integrated circuit to be calibrated by automated test equipment, the integrated circuit including an active circuit including a first ground connection (e.g., a cascode-based amplifier) and a bias network coupled to the active circuit and including a second ground connection, the bias network configured to provide a calibrated bias voltage to the active circuit corresponding to a specified current for the active circuit. The method includes: coupling a calibration circuit to the first ground connection and the second ground connection, wherein the calibration circuit is part of the integrated circuit [BLOCK 702]; and configuring the calibration circuit to balance a voltage at the first ground connection with a voltage at the second ground connection during calibration of the active circuit [BLOCK 704].

Additional aspects of the above method may include one or more of the following: wherein the calibration circuit includes an op-amp having a first input coupled to the first ground connection, a second input coupled to the second ground connection, and an output indicative of a difference in voltage between the first and second ground connections, and a MOSFET having a gate coupled to the output of the op-amp, a source coupled to a voltage source, and a drain coupled to one of the first input or second input of the op-amp in a negative feedback configuration; further including disabling the calibration circuit after completion of calibration of the active circuit; wherein the integrated circuit is a low-noise amplifier; wherein the integrated circuit is a power amplifier; wherein the integrated circuit is configured to be tested by automated test equipment coupled to the first ground connection and to the second ground connection.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit including:
   (a) an active circuit including a first ground connection;
   (b) a bias network coupled to the active circuit and including a second ground connection, the bias network configured to provide a calibrated bias voltage to the active circuit corresponding to a specified current for the active circuit; and
   (c) a calibration switch coupled between the first ground connection and the second ground connection, the calibration switch configured to be closed during calibration of the active circuit and open after completion of calibration of the active circuit.

2. The invention of claim 1, wherein the integrated circuit is a low-noise amplifier.

3. The invention of claim 1, wherein the integrated circuit is a power amplifier.

4. The invention of claim 1, wherein the calibration switch is a field effect transistor.

5. The invention of claim 1, wherein the calibration switch is a fusible link.

6. The invention of claim 1, wherein the integrated circuit is configured to be tested by automated test equipment coupled to the first ground connection and to the second ground connection.

7. The invention of claim 1, wherein the active circuit is a cascode-based amplifier circuit.

8. An integrated circuit amplifier including:
   (a) an active circuit including a first ground connection;
   (b) a bias network coupled to the active circuit and including a second ground connection, the bias network configured to provide a calibrated bias voltage to the active circuit corresponding to a specified current for the active circuit; and
   (c) a calibration switch coupled between the first ground connection and the second ground connection, the calibration switch configured to be closed during calibration of the active circuit and open after completion of calibration of the active circuit;
   wherein the integrated circuit is configured to be tested by automated test equipment coupled to the first ground connection and to the second ground connection.

9. The invention of claim 8, wherein the integrated circuit amplifier is a low-noise amplifier.

10. The invention of claim 8, wherein the integrated circuit amplifier is a power amplifier.

11. The invention of claim 8, wherein the calibration switch is a field effect transistor.

12. The invention of claim 8, wherein the calibration switch is a fusible link.

13. The invention of claim 8, wherein the active circuit is a cascode-based amplifier circuit.

14. A method of configuring an integrated circuit to be calibrated by automated test equipment, the integrated circuit including an active circuit including a first ground connection and a bias network coupled to the active circuit and including a second ground connection, the bias network configured to provide a calibrated bias voltage to the active circuit corresponding to a specified current for the active circuit, the method including:
   (a) coupling a calibration switch between the first ground connection and the second ground connection, wherein the calibration switch is part of the integrated circuit;
   (b) during calibration of the active circuit by the automated test equipment, closing the calibration switch;
   (c) after completion of calibration of the active circuit by the automated test equipment, opening the calibration switch.

15. The method of claim 14, wherein the integrated circuit is a low-noise amplifier.

16. The method of claim 14, wherein the integrated circuit is a power amplifier.

17. The method of claim 14, wherein the calibration switch is a field effect transistor.

18. The method of claim 14, wherein the calibration switch is a fusible link.

19. The method of claim 14, wherein the calibration switch is permanently opened after completion of calibration of the active circuit.

20. The method of claim 14, wherein the active circuit is a cascode-based amplifier circuit.

* * * * *